(12) United States Patent
Tay

(10) Patent No.: US 6,466,089 B2
(45) Date of Patent: Oct. 15, 2002

(54) CONTROL CIRCUIT FOR INCREASING THE OUTPUT INPEDANCE OF A TRANSCONDUCTOR

(75) Inventor: Hiok Nam Tay, Irvine, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/975,184

(22) Filed: Oct. 11, 2000

(65) Prior Publication Data

US 2002/0067203 A1 Jun. 6, 2002

Related U.S. Application Data

(60) Provisional application No. 60/239,365, filed on Oct. 11, 2000.

(51) Int. Cl.[7] .................................................. H03F 3/45
(52) U.S. Cl. ............................ 330/69; 330/144; 360/68
(58) Field of Search .......................... 330/69, 144, 310, 330/311; 360/68

(56) References Cited

U.S. PATENT DOCUMENTS 3,516,005 A * 6/1970 Brown, Jr. .................. 330/69
5,796,301 A * 8/1998 Tanabe et al. .............. 330/9
6,091,294 A * 7/2000 Shirai et al. ................ 330/69
6,396,343 B2 * 5/2002 Chee ........................... 330/69

* cited by examiner

*Primary Examiner*—Robert Pascal
*Assistant Examiner*—Henry Choe
(74) *Attorney, Agent, or Firm*—W. Daniel Swayze, Jr.; W. James Brady; Frederick J. Telecky, Jr.

(57) ABSTRACT

A transconductance circuit having a high output impedance has a dual input differential transconductor (10) with first (14) and second (16) differential inputs and a differential output (18). The first differential input (14) is connected to receive a dc voltage (20). An inverting feedback path is connected between the second differential input (16) and the differential output (18). A differential difference amplifier (24) has a first input (26) connected to receive the dc voltage (20) and a second input (28) connected to the inverting feedback path. A variable resistor (22) is connected across the differential output (18). The output (30) of the differential difference amplifier (24) is connected to control the variable resistor (22) to minimize the output of the differential difference amplifier (24), thereby creating a high output impedance from said transconductor (10).

6 Claims, 1 Drawing Sheet

CONTROL CIRCUIT FOR INCREASING THE OUTPUT INPEDANCE OF A TRANSCONDUCTOR

This application claims priority under 35 USC § 119(e)(1) of provisional application Ser. No. 60/239,365, filed Oct. 11, 2000.

BACKGROUND OF THE INVENTION

1. Field of the Invention

This invention relates to improvements in transconductors, or the like, and methods for constructing same, and more particularly to improvements in methods and circuits for controlling the output impedance of a transconductor.

2. Relevant Background

A transconductor is a voltage controlled differential transconductance stage or circuit. Transconductance circuits are used in many applications, among which, for example is in driver circuits that supply drive power to a dc motor used to spin a disk of a hard disk drive, or the like.

In the construction of transconductor circuits, efforts are generally made to make the output impedance of the transconductor as high as possible. Traditional methods use a copy of the transconductor placed in an oscillator with feedback control so that oscillation is maintained at a constant amplitude. In this condition, the transconductor output impedance is nearly infinite. There are problems with this approach, however. For example, in such circuit, signals from the oscillator are inevitably leaked to the target transconductor. This is, of course, undesirable.

What is needed, therefore, is a differential transconductor which has a controlled high output impedance, and which does not leak oscillator signals to the target circuit.

SUMMARY OF THE INVENTION

In light of the above, therefore, it can be seen that one advantage of the invention is that a differential transconductor can be provided which has a controlled high output impedance and which does not leak oscillator signals to the target circuit.

This and other objects, features, and advantages will be appreciated by those skilled in the art from the following detailed description, taken in conjunction with the accompanying drawings and appended claims.

According to a broad aspect of the invention, a method is presented for controlling the output impedance of a transconductor having first and second differential inputs and a differential output. The method includes applying a dc voltage to the first differential input of the transconductor and to a first differential input of a differential difference amplifier. An inverted output of the differential output of said transconductor is applied to the second differential input of the transconductor and to a second differential input to the difference amplifier. The output of said transconductor is applied to a variable resistor that is controlled by an output of the difference amplifier.

According to another broad aspect of the invention, a transconductance circuit is presented which has a high output impedance. The transconductance circuit has a dual input differential transconductor having first and second differential inputs and a differential output. The first differential input is connected to receive a dc voltage. An inverting feedback path is connected between the second differential input and the differential output. A differential difference amplifier has a first input connected to receive the dc voltage and a second input connected to the inverting feedback path. A variable resistor is connected across the differential output. The output of the differential difference amplifier is connected to control the variable resistor to minimize the output of the differential difference amplifier.

BRIEF DESCRIPTION OF THE DRAWINGS

The invention is illustrated in the accompanying drawings, in which.

DETAILED DESCRIPTION OF THE PREFERRED EMBODIMENTS

Figure 1:
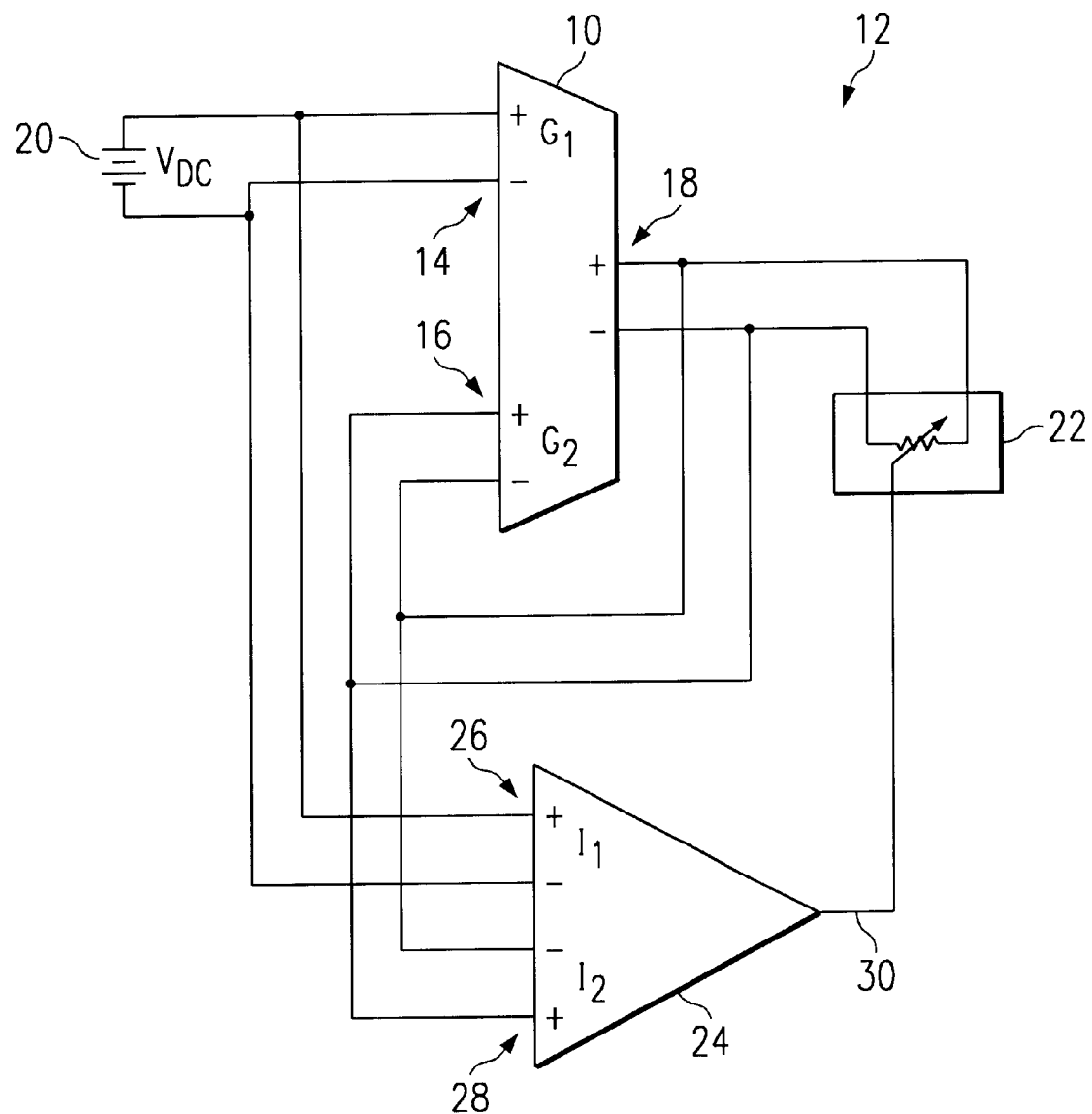
FIG. 1 is an electrical schematic diagram of a transconductor and associated circuitry to control the output impedance to near infinity, in accordance with a preferred embodiment of the invention.

In accordance with a preferred embodiment of the invention, a transconductor 10, is presented, together with associated control circuitry 12 to control the output impedance to near infinity. The transconductor 10 has dual differential inputs 14 and 16, and a differential output 18. A dc voltage 20 is applied to the first differential input 14, and the output on the differential output 18 is inverted and applied to the second differential input 16. The output on the differential output 18 is also applied to a variable resistance circuit 22, which is a part of the control circuitry 12.

The control circuitry 12 includes, in addition to the variable resistance circuit 22, a differential difference amplifier 24, which has two sets of differential inputs 26 and 28, and a single output 30. The dc voltage 20 is applied to the first differential input 26, with the same polarity as it is applied to the first differential input 18 of the transconductor 10. The output of the transconductor 10 is applied to the second differential input 28 with an inverted polarity signal applied to the gates of input transistors 12 and 14.

The construction of the variable resistance circuit 22 is such that it has a variable resistance that is controlled by the output signal 30 from the differential difference amplifier 24. It should be noted that in the particular application described, the variable resistance may be or include negative resistance values.

The negative feedback loop formed by the differential difference amplifier 24 forces the difference between inputs 14 and 18 of the transconductor 10 to be minimal. This difference is limited by the input offset of the differential difference amplifier 24.

With the circuit constructed as above described, the net transconductance current is zero, since the two inputs (which have equal transconductances) are equal in magnitude but opposite in polarity. Since net current entering any node must be zero (Kirchhoff's Current Law), and since the net current entering the output nodes equals the sum of transconductance current and output conductance current, the latter must also be zero. However, the transconductor output voltage is a non-zero DC voltage (in fact equal to the voltage of the first differential input to the transconductor). Hence the impedance looking into the output of the transconductor must be infinite.

The impedance control feedback loop controls the input control signal to the variable resistance circuit 22 such that its output conductance cancels the output conductance of the transconductor. This input control signal, which could be a voltage signal, may then be used in other transconductors, for example, in a continuous-time filter that each has a similar variable resistance circuit.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A method for controlling the output impedance of a transconductor having first and second differential inputs and a differential output, comprising:

applying a dc voltage to said first differential input of said transconductor and to a first differential input of a differential difference amplifier;

applying an inverted output of said differential output of said transconductor to said second differential input of said transconductor and to a second differential input to said difference amplifier;

applying said output of said transconductor to a variable resistor; and controlling a resistance of said variable resistor by an output of said difference amplifier.

2. The method of claim 1 wherein said variable resistor presents a negative resistance to said output of said transconductor.

3. A circuit for controlling the output impedance of a transconductor having a first differential input for receiving a dc voltage, a second differential input, and a differential output, comprising:

a inverting connection from said differential output of said transconductor to said second differential input of said transconductor;

a differential difference amplifier having a first input connected to receive said dc voltage, a second input connected to receive and an inverted output from said transconductor, and an output; and a variable resistor across which said output of said transducer is connected;

said output of said differential difference amplifier being connected to control said variable resistor to minimize the output of said differential difference amplifier.

4. The circuit of claim 3 wherein said variable resistor had a negative resistance.

5. A transconductance circuit having a high output impedance, comprising:

a dual input differential transconductor having first and second differential inputs and a differential output, said first differential input being connected to receive a dc voltage, an inverting feedback path between said second differential input and said differential output;

a differential difference amplifier having a first input connected to receive said dc voltage and a second input connected to said inverting feedback path, and an output;

a variable resistor connected across said differential output; and said output of said differential difference amplifier being connected to control said variable resistor to minimize said output of said differential difference amplifier.

6. The method of claim 5 wherein said variable resistor has a negative resistance.

* * * * *

UNITED STATES PATENT AND TRADEMARK OFFICE
CERTIFICATE OF CORRECTION

PATENT NO. : 6,466,089 B2
DATED : October 15, 2002
INVENTOR(S) : Hiok-Nam Tay

It is certified that error appears in the above-identified patent and that said Letters Patent is hereby corrected as shown below:

<u>Title page,</u>
Item [22], delete " [22], Filed: Oct. 11, 2000" and replace with -- [22] Filed: Oct., 11, 2001 --.

Signed and Sealed this

Fourth Day of March, 2003

JAMES E. ROGAN
*Director of the United States Patent and Trademark Office*